United States Patent

Ting et al.

[11] Patent Number: 5,814,408
[45] Date of Patent: Sep. 29, 1998

[54] ALUMINUM MATRIX COMPOSITE AND METHOD FOR MAKING SAME

[75] Inventors: Jyh-Ming Ting, Fairborn; Max Laverne Lake, Yellow Springs, both of Ohio

[73] Assignee: Applied Sciences, Inc., Cedarville, Ohio

[21] Appl. No.: 594,588

[22] Filed: Jan. 31, 1996

[51] Int. Cl.$^6$ .............................. B32B 9/08; B32B 9/17; B32B 9/14

[52] U.S. Cl. .................... 428/408; 428/389; 428/549; 264/29.1; 264/29.2; 264/29.3; 264/109

[58] Field of Search ..................... 429/218; 264/29.1, 264/29.2, 29.3, 109; 428/549, 408, 387

[56] References Cited

U.S. PATENT DOCUMENTS

| | | |
|---|---|---|
| 5,322,109 | 6/1994 | Cornie . |
| 5,433,906 | 7/1995 | Dasch et al. . |
| 5,512,393 | 4/1996 | Harada et al. .......................... 429/218 |

Primary Examiner—Richard Weisberger
Attorney, Agent, or Firm—Killworth, Gottman, Hagan & Schaeff, L.L.P.

[57] ABSTRACT

An aluminum matrix composite is provided comprising a preform formed from interwoven mats of graphitized vapor grown carbon fibers. The mats comprise semi-aligned, semi-continuous vapor grown carbon fibers which have been interwoven in situ during growth. The preferred method of producing the composite includes the steps of providing a vapor grown carbon preform and infiltrating molten aluminum into the interstices of the preform by a pressure casting process. The resulting aluminum matrix composite has a thermal conductivity of between about 600 W/m-K and 700 W/m-K and is useful as a component in electronic devices, aircraft, spacecraft, and other thermal management applications.

12 Claims, 2 Drawing Sheets

ALUMINUM MATRIX COMPOSITE AND METHOD FOR MAKING SAME

GOVERNMENT RIGHTS

This invention was made with Government support under Contract No. F29601-93-C-0165 awarded by the U.S. Air Force Systems Command. The Government has certain rights in the invention.

BACKGROUND OF THE INVENTION

The present invention relates to a metal matrix composite useful in thermal management applications, and to a method for making such a composite. More particularly, the present invention relates to an aluminum matrix composite having high thermal conductivity formed from a preform comprised of interwoven mats of graphitized vapor grown carbon fibers having aluminum infiltrated therein.

Composite materials are well known for use in structural applications. In recent years, composites have also become desirable for use in thermal management applications. For example, metal matrix composites have been found to be useful for heat dissipation in electronic packaging. Typical metal matrix composites for electronic packaging components exhibit coefficients of thermal expansion (CTE) which may be tailored by varying the architecture of reinforcing agents. By incorporating lower density reinforcing agents, it has been found that the composites exhibit reduced weight as compared to neat metals. Such reinforcing agents may include carbon fibers, which are typically used to reinforce aluminum or copper composites, and silicon carbide particles or diamond particles, which are used to reinforce aluminum composites. However, the resulting composite materials have not shown substantial improvements in thermal conductivity, which is an important requirement for electronic packaging components. In addition, it has been found that the use of these carbon fibers as reinforcing agents in aluminum composites leads to the formation of a carbide interface material which adversely affects the thermal conductivity and mechanical properties of the resulting composite.

More recently, vapor grown carbon fibers have been studied for use in thermal management applications. Such fibers are grown through the pyrolysis of hydrocarbon gas in the presence of a metal catalyst. Vapor grown carbon fibers have a higher thermal conductivity than any other carbon fiber or metal and may be produced at a lower cost. Vapor grown carbon fibers also exhibit the highest degree of graphitic perfection of any known carbon fiber. As a result of their unique graphitic structure, such fibers could be incorporated in metal composites without the problem of carbide formation.

However, while such fibers exhibit superior physical properties, they are typically grown in discontinuous form, and must be mechanically interwoven prior to their use as reinforcements in composites. As a result, discontinuous vapor grown carbon fibers have not been widely used in metal composites as the weaving of such fibers is time consuming and adds to production costs.

Accordingly, there is still a need in the art for improved metal matrix composites for use in thermal management applications which exhibit high thermal conductivity, which may be produced without undesirable carbide formation, and which may be produced at low cost.

SUMMARY OF THE INVENTION

The present invention meets that need by providing an aluminum matrix composite which exhibits high thermal conductivity and which may be used in a variety of thermal management applications. The aluminum matrix composite is formed from mats of graphitized vapor grown carbon fibers which have been interwoven in situ during growth, thus eliminating the use of individual discontinuous fibers which must be mechanically interwoven in a separate process step.

In accordance with one embodiment of the invention, an aluminum matrix composite is provided which comprises a preform containing interwoven mats of graphitized vapor grown carbon fibers. The preform includes interstices therein which have been infiltrated with aluminum.

Preferably, the mats in the preform are comprised of semi-aligned, semi-continuous vapor grown carbon fibers which have been interwoven in situ during growth. The fibers are also preferably graphitized, i.e., they are heat treated at a temperature of about 2800° C. or higher to convert a portion of the carbon contained in the fibers to graphitic carbon.

Preferably, the room temperature thermal conductivity of the vapor grown carbon fiber mat of the present invention is about 1760 W/m-K, which results in an aluminum matrix composite having a thermal conductivity of between about 600 W/m-K and 700 W/m-K.

A method of making the aluminum matrix composite is also provided which generally comprises the steps of providing a preform comprising interwoven mats of graphitized vapor grown carbon fibers and infiltrating the interstices of the preform with molten aluminum.

Preferably, the preform is infiltrated with aluminum by a pressure casting technique in which aluminum is heated to a temperature slightly above its liquidus and the preform is heated independently to a temperature slightly below the aluminum solidus. When the temperatures of the aluminum and preform reach those states, pressure is applied so that infiltration is initiated.

The method of the present invention is cost-effective and efficient as the use of vapor grown carbon fiber mats eliminates the need to mechanically weave individual grown fibers into a mat prior to their use in the composite. Such interwoven mats of vapor grown carbon fibers also allow a wider range of fiber loading, i.e., from 15 volume percent to 70 volume percent, without resulting in inhomogeneous infiltration, which is commonly experienced with low volume fractions of conventional fibers. Such a wide range of fiber loading enables the coefficient of thermal expansion (CTE) and other properties of the composite to be controlled over a wider range and therefore increases the number of applications in which the resulting composites can be used.

Further, the resulting aluminum matrix composite exhibits a higher thermal conductivity than composites reinforced with other carbon fibers. In addition, no carbide formation is found in the resulting aluminum matrix composites.

The aluminum matrix composite may be used in many thermal management applications including aircraft, spacecraft, and electronic devices.

Accordingly, it is a feature of the present invention to provide an aluminum matrix composite formed from interwoven vapor grown carbon fiber mats which exhibit high thermal conductivity. It is a further feature of the present invention to provide a cost-effective method of producing such a metal matrix composite. These, and other features and advantages of the invention will become apparent from the following detailed description, the accompanying drawings, and the appended claims.

DETAILED DESCRIPTION OF THE PREFERRED EMBODIMENT

The vapor grown carbon fiber-reinforced aluminum matrix composite of the present invention provides many advantages over composites which use other reinforcing agents such as conventional carbon fibers. For example, the vapor grown carbon fiber mat has the highest thermal conductivity, which in turn results in a higher thermal conductivity for the resulting composite. Vapor grown carbon fibers also exhibit the lowest electrical resistivity among all carbon fibers. This is of importance since electromagnetic shielding is required in some electronic packaging components.

In addition, while other carbon fibers are produced in discontinuous form and must be mechanically interwoven prior to use in a composite, the vapor grown carbon fiber mats of the present invention consist of semi-aligned, semi-continuous fibers which are interwoven in situ during growth. Thus, the mats of the present invention are essentially produced in a one-step process and do not require any further mechanical weaving prior to the making of the composite. Accordingly, the aluminum matrix composite of the present invention may be produced at much lower cost than conventional metal matrix composites.

Further, while the use of carbon fibers in aluminum matrix composites results in carbide formation which adversely affects the thermal conductivity of the resulting composite, the use of vapor grown carbon fibers in the present invention results in no carbide formation. This is due to the fact that graphitized vapor grown carbon fibers have a unique structure which exposes only graphite basal planes on the fiber surface. Under controlled conditions, the inert graphite basal planes avoid carbide formation on contact with molten aluminum.

Figure 2:
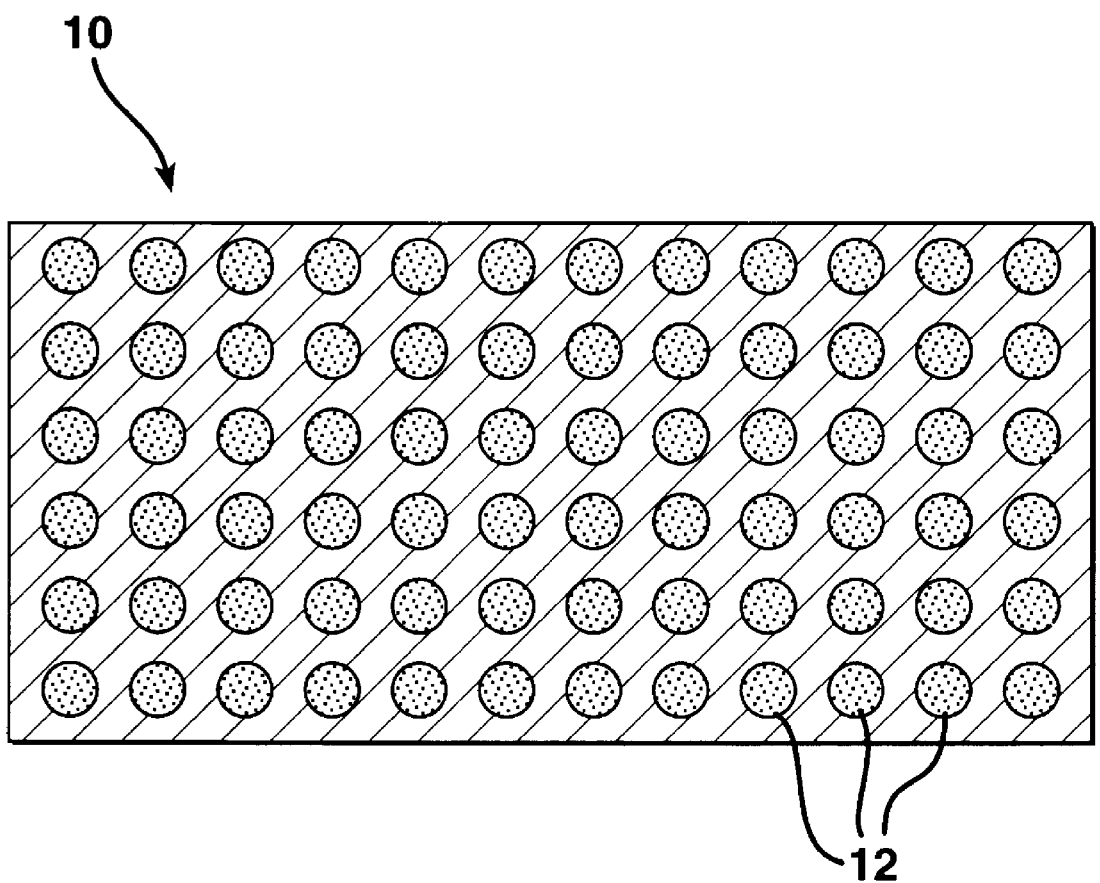
FIG. 2 is a cross-sectional view of the aluminum matrix composite of the present invention.

The aluminum matrix composite 10 of the present invention is illustrated in FIG. 2. As shown, the aluminum matrix composite comprises a preform of interwoven mats of graphitized vapor grown carbon fibers 12. It should be appreciated that the composite may have a number of different shapes depending on its desired end use.

Figure 1A:
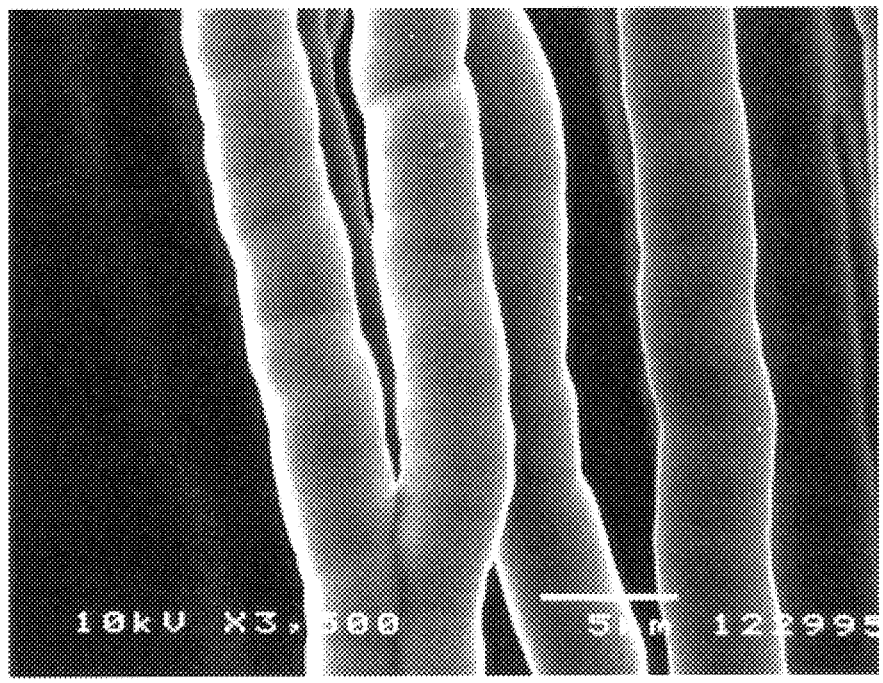
FIG. 1A is a photomicrograph illustrating the mat of the present invention showing vapor grown carbon fibers having a unidirectional orientation.
Figure 1B:
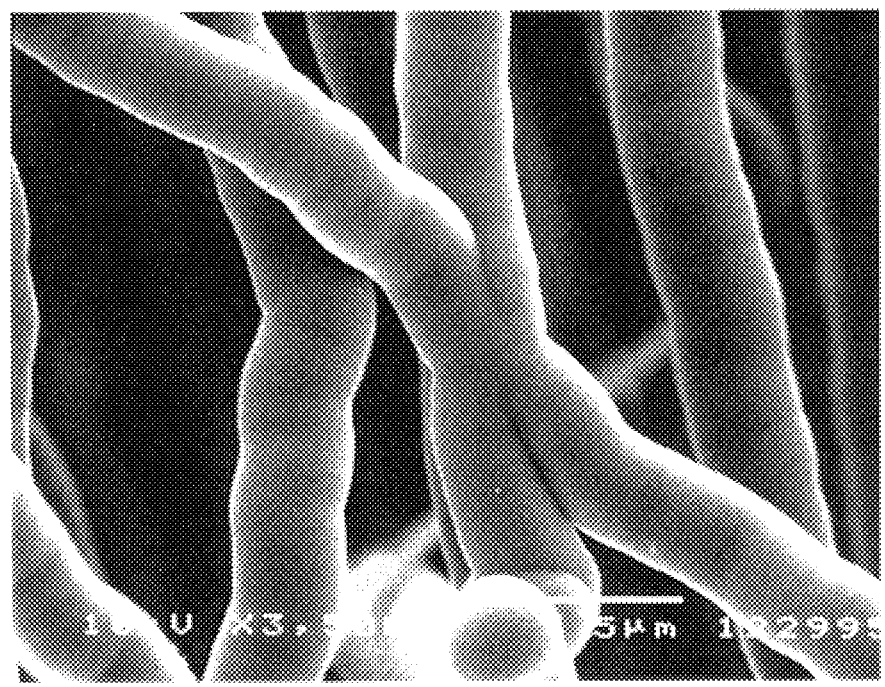
Fig. 1B is a photomicrograph illustrating the mat of the present invention showing vapor grown carbon fibers having a two-directional orientation.

The mats consist of semi-aligned, semi-continuous vapor grown carbon fibers as illustrated in FIGS. 1A and 1B, and the fibers may have unidirectional (FIG. 1A) or two-directional (Fig. 1B) orientation. The orientation and weaving of the fibers in the mats may be controlled by gas flow conditions during fiber growth.

It should be appreciated that the number of mats contained in the preform may vary depending on the desired dimensions and on the desired end use for the resulting composite. For example, the use of 12 to 15 mat plies results in a composite having a final thickness of about 15 mils. The dimensions of the individual mats may also be varied as desired.

The vapor grown carbon fiber mat is preferably grown on a substrate which has been previously seeded with iron particles. The substrate is placed in a reactor and a unidirectional flowing gas mixture of methane and hydrogen is introduced at a temperature of about 1000° C. Some of the fibers become intertwined during the growth cycle which is promoted by varying the gas flow rate. For example, the gas flow rate may be altered from 200 sccm per minute to 2000 sccm per minute for a duration of 30 seconds at various intervals during fiber growth. The direction of the gas flow may also be used to promote interweaving of the fibers. For example, the gas may be introduced at the side of the reactor in which the fibers are grown rather than from the center. As a result, the fibers thicken during the growth process, causing junctions to form between the interwoven fibers. Such junctions contribute to the continuity of the graphitic lattice structure, thus enabling more efficient transfer of thermal energy within the mat. Such junctions also contribute to the mechanical strength of the mats, enabling them to be uniformly infiltrated with molten aluminum at low fiber loadings of 15 volume percent or less. This provides a significant advantage over the low fiber loading of conventional fibers, which typically results in channeling of the metal into nonuniform distributions within the metal matrix composite. Uniform distribution of reinforcements in the matrix is needed to provide uniform composite properties. The ability to fabricate a fiber reinforced composite with a wide range of fiber loadings enables composite designers to control the coefficient of thermal expansion (CTE) as well as thermal and electrical conductivity and mechanical properties of the composite over a correspondingly larger range.

The vapor grown fiber mats produced from this process are then graphitized by heat treatment in an inert gas to a temperature of 2800° C. A preform is then prepared from the resulting graphitized interwoven mats.

Infiltration of the vapor grown carbon fiber mat preform with molten aluminum may be accomplished by conventional methods which include pressure casting and hot isostatic pressing. Preferred is a pressure casting process as taught in Cornie, U.S. Pat. No. 5,322,109, the disclosure of which is hereby incorporated by reference. The process includes the placement of the preform into a mold which is then inserted into a quartz tube. Solid aluminum is added to the top of the mold cavity and then heated to a temperature above its liquidus (i.e., from about 680C to 720C) while the preform is heated independently to a temperature below the aluminum solidus (i.e., from about 600C to 650C). Pressure is then applied when the temperatures of the aluminum and preform reach the desired points, causing infiltration to occur. The pressure is preferably in the range of from about 3 atm. to 500 atm. It should be appreciated that the temperatures and pressures required to carry out the infiltration may vary depending on the particular aluminum alloy being used. The mold is then cooled, whereupon the aluminum re-solidifies. Thereafter, the aluminum matrix is removed from the mold.

The resulting aluminum matrix composite may exhibit a thermal conductivity of between about 600–700 W/m-K after infiltration. The aluminum matrix composites of the present invention are especially suited for use in electronic devices and packaging, and in aircraft and spacecraft thermal management.

The following example is for purposes of illustrating the present invention. The example is not to be considered as limiting the scope of the claims appended hereto.

EXAMPLE 1

Aluminum matrix composites were prepared in accordance with the present invention. First, vapor grown carbon fiber mats were produced by seeding a substrate with iron particles and placing the substrate in a reactor containing a flowing gas mixture of methane and hydrogen at a temperature near 1000° C.

After removal from the reactor, mats of vapor grown carbon fibers were shaved from the substrate and cut to dimensions of about 5 cm by 30 cm. Preforms were then prepared from the fiber mats using furfuryl alcohol as a binder. The preforms were then heated treated (graphitized) at 2800° C. in an argon atmosphere.

The preforms were then infiltrated with aluminum using a pressure casting technique. The preforms were placed in a mold which was then inserted into a quartz tube. Solid aluminum was then added to the top of the mold cavity. The aluminum was heated to a temperature above its liquid state (from about 680° C. to 720° C.) while the preform was heated independently to a temperature below the solid state of aluminum (from about 600° C. to 650° C.). Pressure of between about 3 atm. to 500 atm. was applied when the temperatures of the metal and preform reached the desired points to allow the infiltration to occur.

Six composites were formed from this method. Specimens having measurements of about 10 cm ×0.5 cm ×0.5 cm were then cut from the composites and measured for thermal conductivity from room temperature to 400° C. using a Kohlrausch method. The results are shown below in Table I. For comparison purposes, the thermal conductivity and electrical resistivity of neat aluminum is shown.

TABLE I

| Specimen | Fiber Volume Fraction (%) | Density (g/cc) | Thermal Conductivity (W/m-K) | | Electrical Resistivity (microhm-cm) | |
|---|---|---|---|---|---|---|
| | | | X | Y | X | Y |
| 1 | 17.2 | 2.58 | 397 | 225 | 6.21 | 7.70 |
| 2 | 20.6 | 2.55 | 339 | 287 | 7.23 | 8.93 |
| 3 | 19.3 | 2.56 | 356 | 265 | 6.27 | 8.16 |
| 4 | 26.6 | 2.51 | 333 | — | — | — |
| 5 | 27.9 | 2.50 | 534 | — | 8.32 | — |
| 6 | 36.5 | 2.44 | 642 | — | — | — |
| A1 | | 2.699 | 235 | | ~4 | |

As can be seen, the use of the vapor grown carbon mats greatly increases the thermal conductivity of aluminum. More than a 50% increase in thermal conductivity over neat aluminum was achieved by using less than 18 fiber volume percent of vapor grown carbon fibers.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. An aluminum matrix composite comprising:
   a preform comprising interwoven mats of graphitized vapor grown carbon fibers, said preform having interstices therein which have been infiltrated with aluminum.

2. The aluminum matrix composite of claim 1 in which said vapor grown carbon fiber mats exhibit a room temperature thermal conductivity of about 1760 W/m-K.

3. The aluminum matrix composite of claim 1 having a thermal conductivity of between about 600 W/m-K and 700 W/m-K.

4. The aluminum matrix composite of claim 1 wherein said mats comprise semi-aligned, semi-continuous vapor grown carbon fibers said vapor grown carbon fibers being interwoven to form said mats during in situ growth of said vapor grown carbon fibers.

5. The aluminum matrix composite of claim 1 in which said fibers have been graphitized by heat treatment at a temperature of at least 2800° C.

6. A method of making an aluminum metal matrix composite comprising the steps of:
   providing a preform comprising interwoven mats of graphitized vapor grown carbon fibers, said preform having interstices therein; and
   infiltrating the interstices of said preform with molten aluminum; and
   cooling said preform to produce an aluminum matrix composite.

7. The method of claim 6 wherein said mats comprise semi-aligned, semi-continuous vapor grown carbon fibers, said vapor grown carbon fibers being interwoven to form said mats during in situ growth of said vapor grown carbon fibers.

8. The method of claim 6 wherein said infiltration step includes the steps of placing said preform into a mold, adding solid aluminum to said mold, heating said aluminum to a temperature above its liquidus, heating said preform to a temperature below the aluminum solidus, and applying pressure to said mold.

9. The method of claim 8 in which said aluminum is heated to a temperature of about 680° C. to 720° C.

10. The method of claim 8 in which said preform is heated to a temperature of about 600° C. to 650° C.

11. The method of claim 8 in which a pressure of from about 3 atm. to 500 atm. is applied to said mold.

12. The method of claim 6 in which said preform is uniformly infiltrated at low fiber volume fractions of 25 volume percent or less.

* * * * *